United States Patent
Nemoto et al.

(10) Patent No.: US 6,875,672 B2
(45) Date of Patent: Apr. 5, 2005

(54) METHOD OF MANUFACTURING A SEMICONDUCTOR DEVICE WITH PENETRATION ELECTRODES THAT PROTRUDE FROM A REAR SIDE OF A SUBSTRATE FORMED BY THINNING THE SUBSTRATE

(75) Inventors: Yoshihiko Nemoto, Tokyo (JP); Tomonori Fujii, Tokyo (JP); Masahiro Sunohara, Nagano (JP); Tomotoshi Sato, Osaka (JP)

(73) Assignees: Mitsubishi Denki Kabushiki Kaisha, Tokyo (JP); Sharp Kabushiki Kaisha, Osaka (JP); Taiyo Yuden Co., Ltd., Tokyo (JP); Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/629,695

(22) Filed: Jul. 30, 2003

(65) Prior Publication Data
US 2004/0137705 A1 Jul. 15, 2004

(30) Foreign Application Priority Data
Jan. 14, 2003 (JP) ........................................ 2003-005766

(51) Int. Cl.⁷ .......................................... H01L 21/4757
(52) U.S. Cl. ....................... 438/458; 438/459; 438/667; 438/928
(58) Field of Search ................................ 438/458, 459, 438/667, 672, 675, 928, 977; 257/621, 774

(56) References Cited

U.S. PATENT DOCUMENTS

| | | | |
|---|---|---|---|
| 4,978,639 A | * 12/1990 | Hua et al. | 438/465 |
| 5,260,169 A | * 11/1993 | Nakano | 430/314 |
| 5,424,245 A | * 6/1995 | Gurtler et al. | 438/107 |
| 5,528,080 A | * 6/1996 | Goldstein | 257/741 |
| 5,646,067 A | * 7/1997 | Gaul | 438/458 |
| 6,313,517 B1 | * 11/2001 | Lauterbach et al. | 257/621 |
| 6,365,513 B1 | * 4/2002 | Furukawa et al. | 438/667 |
| 6,639,303 B2 | * 10/2003 | Siniaguine | 257/621 |
| 6,734,084 B1 | * 5/2004 | Nemoto et al. | 438/466 |

FOREIGN PATENT DOCUMENTS

| JP | 10-74891 | 3/1998 |
|---|---|---|
| JP | P2001-26326 A | 11/2001 |

* cited by examiner

Primary Examiner—Stephen W. Smoot
(74) Attorney, Agent, or Firm—McDermott Will & Emery LLP

(57) ABSTRACT

A method for manufacturing a semiconductor device can prevent defective products resulting from a plating liquid when surfaces of protruded portions of penetration electrodes are subjected to plating. An organic insulation film (14) is formed on one surface of a substrate proper (10), and a support member (16) is adhered to the organic insulation film (adhesion step). A rear side of the substrate proper is removed until protruded portions (6) of penetration electrodes (7) are exposed, thereby to form a semiconductor substrate (5). Plating films (8) are formed on the surfaces of the protruded portions (6), and the support member and the organic insulation film are removed from the semiconductor substrate. The organic insulation film has an adhesive property and chemical resistance to chemical substances used in respective steps after the adhesion step, and it is at least dissolved in or peeled off from a chemical substance used in the removal step.

10 Claims, 6 Drawing Sheets

METHOD OF MANUFACTURING A SEMICONDUCTOR DEVICE WITH PENETRATION ELECTRODES THAT PROTRUDE FROM A REAR SIDE OF A SUBSTRATE FORMED BY THINNING THE SUBSTRATE

BACKGROUND OF THE INVENTION

1. Field of the Invention

The present invention relates to a method for manufacturing a semiconductor device which includes a semiconductor substrate that has semiconductor circuits and electrodes formed on a principal plane thereof, with through holes extending from the principal plane to a rear surface of the semiconductor substrate, a penetration electrode that is arranged in each of the through holes, and has a protruded portion protruded from the rear surface of the semiconductor substrate, and a plating film that is formed on a surface of each of the protruded portions by coating a brazing material thereon through plating.

2. Description of the Related Art

In the past, a method for manufacturing a semiconductor device with penetration electrodes has been known in which in the manufacturing process of the semiconductor device, a support member for supplementing the mechanical rigidity of a substrate main body or substrate proper having semiconductor circuits is adhered to the substrate proper by means of a binding or adhesive material, and the rear side of the support member is thereafter ground (for instance, see a first patent document: Japanese patent application laid-open No. Hei 10-74891).

In this known method for manufacturing a semiconductor device, the support member is adhered to the substrate proper through the binding material alone before the rear side of the substrate proper is ground. Therefore, peeling is liable to take place between the substrate proper and the support member, thus causing the following problem. That is, when the electrodes embedded in the substrate proper are protruded from the rear surface thereof as penetration electrodes by removing the rear surface of the substrate proper, and the surfaces of the protruded portions are then subjected to plating, a plating liquid might permeate between the substrate proper and the support member, thereby causing defective products.

In addition, if the binding material is replaced by a stronger one, the problem of permeation of the plating liquid would not occur, but another problem will take place in this case. That is, when the support member that becomes finally unnecessary is peeled off, the binding material remains on the semiconductor substrate and the removal thereof is difficult, thus resulting in the generation of defective products as in the above case.

SUMMARY OF THE INVENTION

The present invention is intended to obviate the above-mentioned various problems, and has for its object to provide a method of manufacturing a semiconductor device which is capable of preventing the generation of defective products resulting from a plating liquid when surfaces of protruded portions of penetration electrodes are subjected to plating.

Bearing the above object in mind, the present invention resides in a method for manufacturing a semiconductor device, which includes: a recess forming step of forming recesses in a substrate proper that has semiconductor circuits and electrodes formed on one surface thereof; an embedded electrode forming step of filling a conductive material into the recesses to form embedded electrodes that constitute penetration electrodes; and a connection step of electrically connecting the electrodes on the substrate proper and the embedded electrodes with one another. The method further includes; an organic film forming step of forming an organic film on the one surface of the substrate proper; an adhesion step of adhering a support member, which supplements the mechanical rigidity of the substrate proper, to the organic film; a semiconductor substrate forming step of removing a rear side of the substrate proper opposite to the one surface thereof until a bottom of each of the embedded electrodes is exposed and protruded, thereby to form the penetration electrodes and a thinned semiconductor substrate; a film forming step of forming plating films on surfaces of the protruded portions of the embedded electrodes; and a removal step of removing the support member and the organic film from the semiconductor substrate. The organic film has an adhesive property and chemical resistance to chemical substances used in respective process steps after the adhesion step, the organic film being at least dissolved in or peeled off from a chemical substance used in the removal step.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Figure 1:
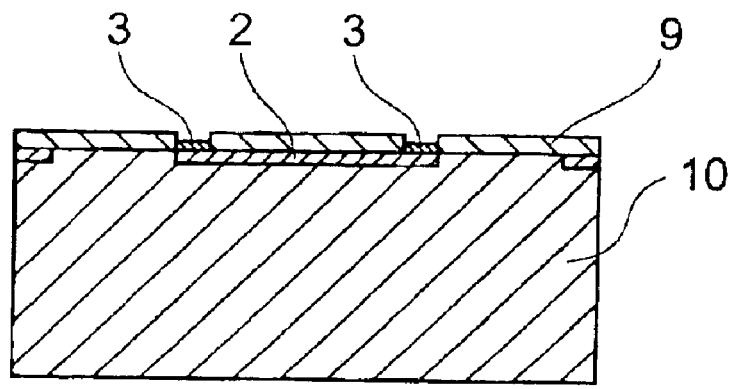
FIG. 1 is a cross sectional view of a semiconductor device in the course of production thereof according to a first embodiment of the present invention.

Hereinafter, preferred embodiments of the present invention will be described in detail while referring to the accompanying drawings. The same or equivalent members and parts are identified by the same symbols throughout the following description of the various preferred embodiments and figures of the accompanying drawings.

Embodiment 1.

FIG. 1 through FIG. 10 show the respective processes of a method for manufacturing a semiconductor device according to a first embodiment of the present invention.

The semiconductor device illustrated in these figures includes: semiconductor circuits 2 formed on a principal plane (i.e., one surface) 1 of a substrate main body or substrate proper 10; a semiconductor substrate 5 (see FIGS. 7 through 10) having electrodes 3, an insulating layer 9, and through holes 4 (see FIG. 10) that extend from the principal plane 1 to a rear surface thereof; penetration electrodes 7 arranged in the through holes 4, respectively, and having protruded portions 6 (see FIGS. 7 through 10) that protrude from the rear surface of the semiconductor substrate 5; and plating films 8 that are formed by coating a brazing material in the form of tin on the protruded portions 6 of the penetration electrodes 7 by means of electroless plating.

Now, a manufacturing procedure for the semiconductor device will be explained below while referring to FIGS. 1 through 10.

FIG. 1 is a cross sectional view of the semiconductor device in the course of production thereof. In this figure, the semiconductor circuits 2, the electrodes 3 and the insulating layer 9 are formed on one surface of the substrate proper 10 made of silicon.

Figure 2:
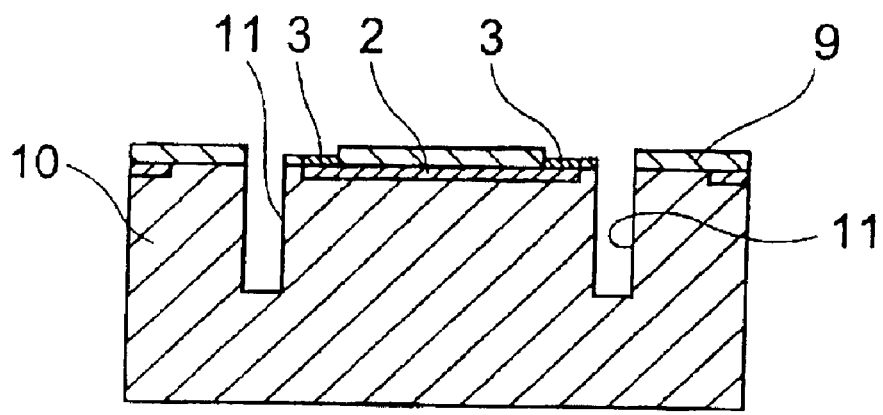
FIG. 2 is a cross sectional view of the semiconductor device in the process of forming recesses in a substrate proper according to the first embodiment of the present invention.

After this, recesses 11 are formed in the substrate proper 10 (see FIG. 2).

Figure 3:
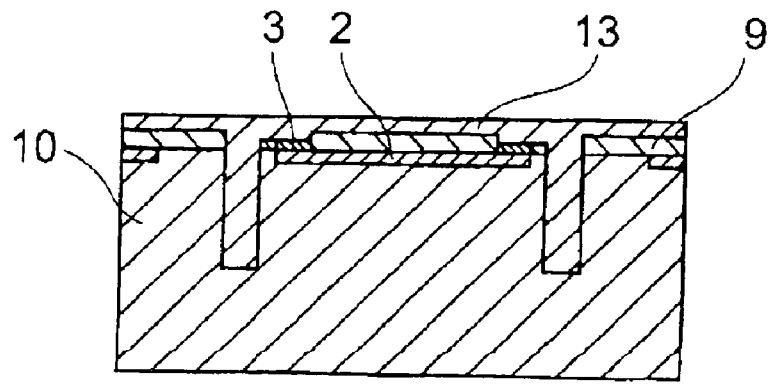
FIG. 3 is a cross sectional view of the semiconductor device in a step of forming embedded electrodes, which constitute penetration electrodes, by filling a conductive material into the recesses according to the first embodiment of the present invention.

Then, a filling or embedding material 13 made of copper is formed on the entire area of the surface of the substrate proper 10 by means of electrolytic plating (see FIG. 3).

Figure 4:
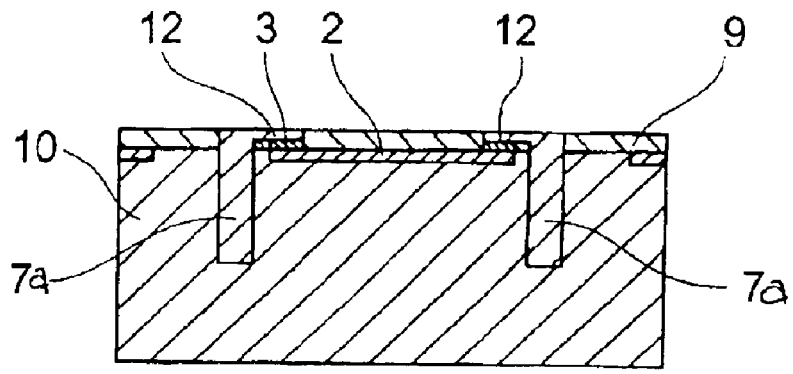
FIG. 4 is a cross sectional view of the semiconductor device in a connection step of electrically connecting electrodes on semiconductor circuits and the embedded electrodes according to the first embodiment of the present invention.

Thereafter, by removing the filling material 13 in unnecessary areas by means of a CMP (Chemical Mechanical Polishing) process, embedded electrodes 7a, which constitute the penetration electrodes 7, are formed by filling copper into the recesses 11, and connecting wirings 12 are also formed by filling copper into grooves defined between the embedded electrodes 7a and the electrodes 3 (see FIG. 4). Here, note that the above processes described to this point are an application of a so-called dual damascene technology.

Figure 5:
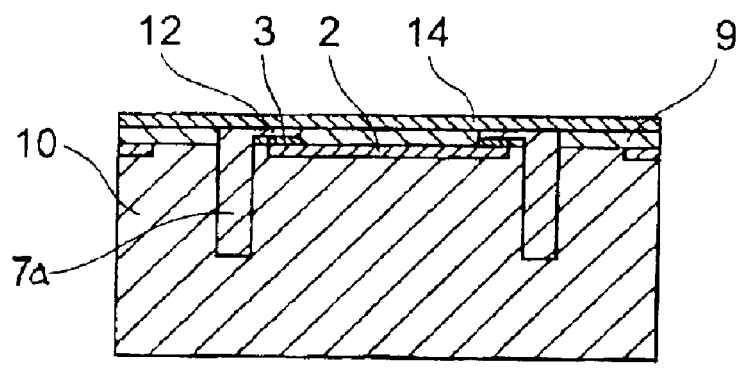
FIG. 5 is a cross sectional view of the semiconductor device in a step of forming an organic insulation film on one surface of the substrate proper according to the first embodiment of the present invention.

Thereafter, a phenol novolak resin, which is a photoresist commonly used in the manufacturing processes of semiconductor devices, is coated on the insulating layer 9 as an organic insulation film 14 (see FIG. 5). In this case, the coating is carried out by using a so-called spin coating method well known in the manufacturing processes of semiconductor devices.

Figure 6:
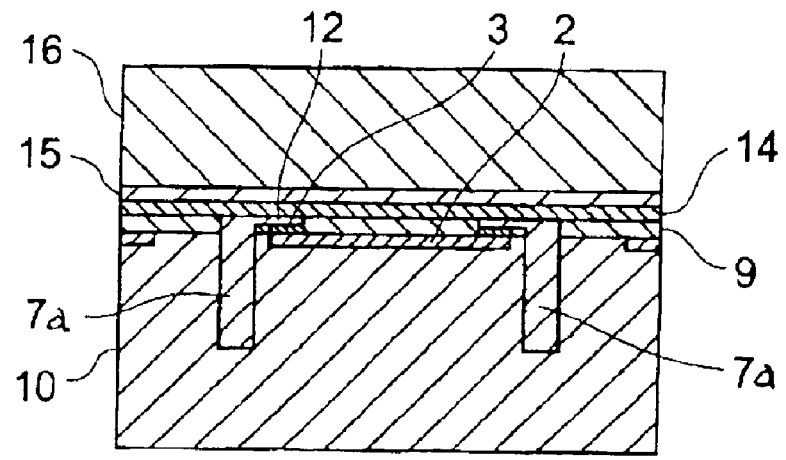
FIG. 6 is a cross sectional view of the semiconductor device in a step of adhering the support member to the organic insulation film according to the first embodiment of the present invention.

Subsequently, a support member 16, which is made of silicon and serves to supplement the mechanical rigidity of the substrate proper 10, is adhered to an organic film in the form of the organic insulation film 14 through a binding layer 15 made of a binding material, which is formed by adhering an acrylic resin to a PET (polyethylene terephthalate) film (see FIG. 6).

Figure 7:
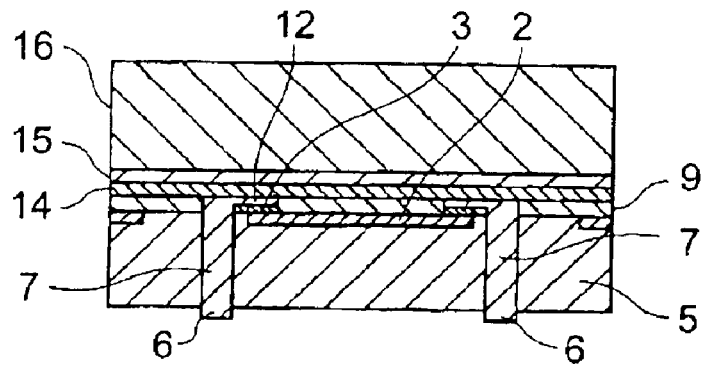
FIG. 7 is a cross sectional view of the semiconductor device in a step of removing a rear side of the substrate proper according to the first embodiment of the present invention.

Then, by removing the rear side of the substrate proper 10 until an end of each embedded electrode 7a is exposed, there are formed the penetration electrodes 7 and the thinned semiconductor substrate 5 (see FIG. 7). The method of removing the rear side of the substrate proper 10 may be any of mechanical grinding, chemical mechanical polishing, and etching, or any combinations thereof.

Figure 8:
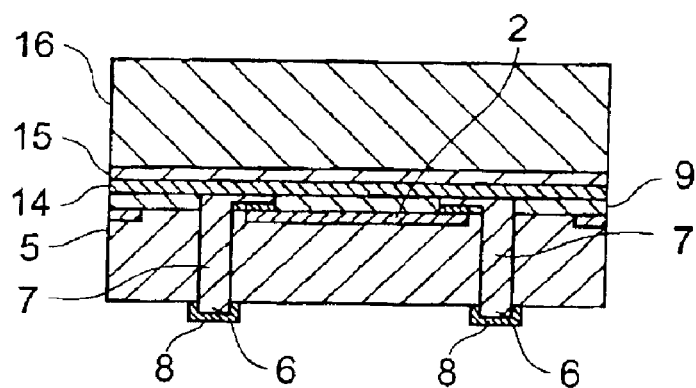
FIG. 8 is a cross sectional view of the semiconductor device in a step of forming plating films on surfaces of protruded portions of the penetration electrodes according to the first embodiment of the present invention.
Figure 9:
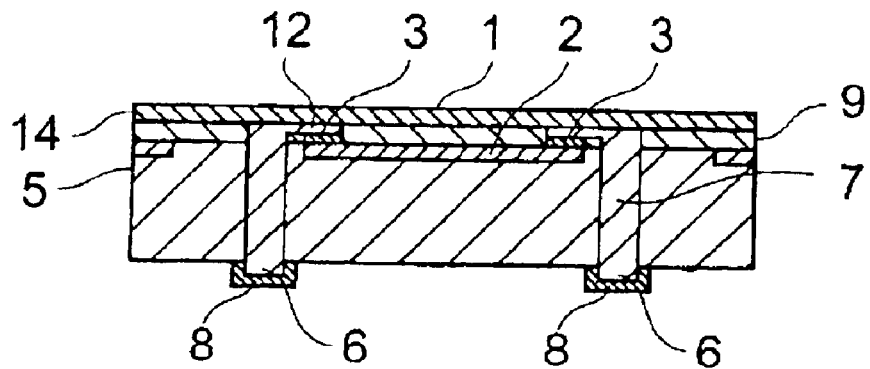
FIG. 9 is a cross sectional view of the semiconductor device in a step of peeling off the support member according to the first embodiment of the present invention.

Thereafter, the surfaces of the protruded portions 6 that have been protruded by removing the rear surface of the substrate proper 10 are further plated with tin by means of electroless plating which is a liquid-phase selective growth process, followed by application thereto of a brazing material for metal melt bonding so as to form the plating films 8 (see FIG. 8). Note that low melting point metals such as an alloy of lead and tin, etc., are used as the brazing material.

Incidentally, in the description of the following respective embodiments, the plating films 8 formed on the protruded portions 6 will be explained by using a brazing material of a low melting point metal, however, when a brazing material is used for counter electrodes to which the penetration electrodes 7 are to be connected, the plating films 8 may be metal films such as, for example, films of an electroless nickel-phosphorus plating layer and an electroless gold plating layer coated thereon, i.e., so-called nickel-gold plating films, which can be alloyed with the brazing material to facilitate connection between the corresponding electrodes. Also, such plating films may simply be gold, platinum, palladium, etc.

In addition, in a plating reaction that grows endlessly through autocatalytic reactions in a theoretical sense as in the electroless nickel phosphorus plating film, there is not necessarily any need to form the protruded portions 6 of the penetration electrodes 7 upon removal of the substrate proper 10. Accordingly, the protruded portions 6 can be formed only by means of the electroless plating reaction under autocatalysis, and hence it is further efficient.

Figure 10:
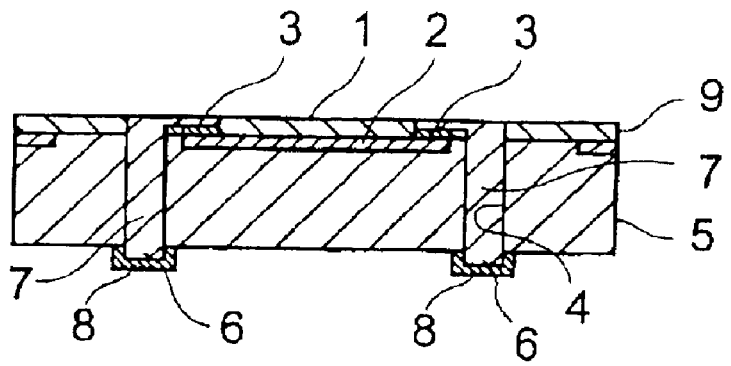
FIG. 10 is a cross sectional view of the semiconductor device in a step of removing the organic insulation film according to the first embodiment of the present invention.

Then, after an end or peripheral portion of the support member 16 is flexed so that it is mechanically peeled off from the semiconductor substrate 5 (see FIG. 9), the organic insulation film 14 remaining on the surface of the semiconductor substrate 5 is removed by using acetone (see FIG. 10).

Here, note that the removal of the support member 16 and the organic insulation film 14 can be carried out in one and the same process by properly selecting materials for the support member, the binding material and the organic insulation film.

According to the method of manufacturing a semiconductor device as described above, the organic insulation film 14 is coated on the surface of the substrate proper 10, and the support member 16 is then adhered to the substrate proper 10 through the binding layer 15. As a result, the binding layer 15 is not in direct contact with the substrate proper 10, and hence there will be no inconvenience of requiring a new removal process or step for removing the binding layer 15 that remains on the surface of the substrate proper 10 upon peeling of the support member 16 from the substrate proper 10.

Moreover, the organic insulation film 14 coated on the surface of the substrate proper 10 is formed of the photoresist commonly used in the manufacturing processes of semiconductor devices. As a consequence, chemical liquids or reactive gases are prevented from permeating through the interface between the organic insulation film 14 and the substrate proper 10. Therefore, there is no possibility that when tin plating is applied to the surfaces of the protruded portions 6, the plating liquid permeates between the organic insulation film 14 and the substrate proper 10 to unnecessarily plate the electrodes 3 and/or other portions on the surface of the substrate proper 10 in a nonuniform manner, or to cause corrosion. Further, the organic insulation film 14 has the property of being able to be easily removed with acetone, so even if the binding layer 15 remains on the surface of the organic insulation film 14, it can be taken off upon removal of the organic insulation film 14.

Furthermore, the coating and removal of the photoresist are the process steps most generally performed in the semiconductor manufacturing processes. Also, the organic insulation film 14 is a cheap material accustomed to be used in the manufacturing processes of semiconductor devices, and the spin coating, which is extremely general and has been established in the art, is used as the method of coating the organic insulation film 14. Accordingly, defective coating is unlikely to take place. Additionally, the removal of the organic insulation film 14 has been generally performed, so there will be caused no defective removal.

Embodiment 2.

Figure 11:
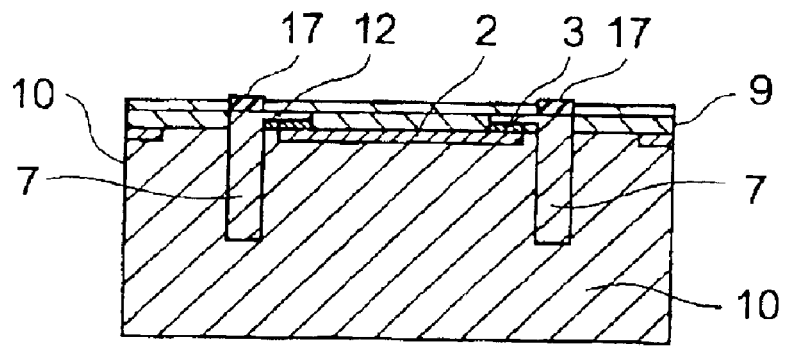
FIG. 11 is a cross sectional view of a semiconductor device in a step of forming protrusion electrodes according to a second embodiment of the present invention.
Figure 12:
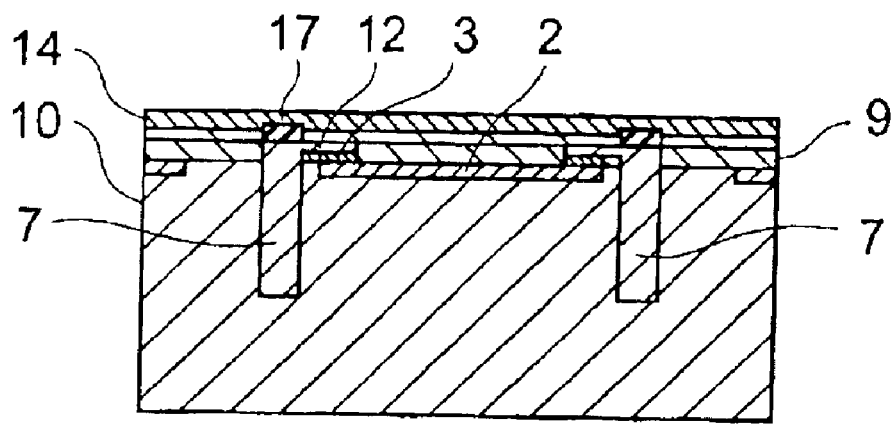
FIG. 12 is a cross sectional view of the semiconductor device in a step of coating an organic insulation film according to the second embodiment of the present invention.
Figure 13:
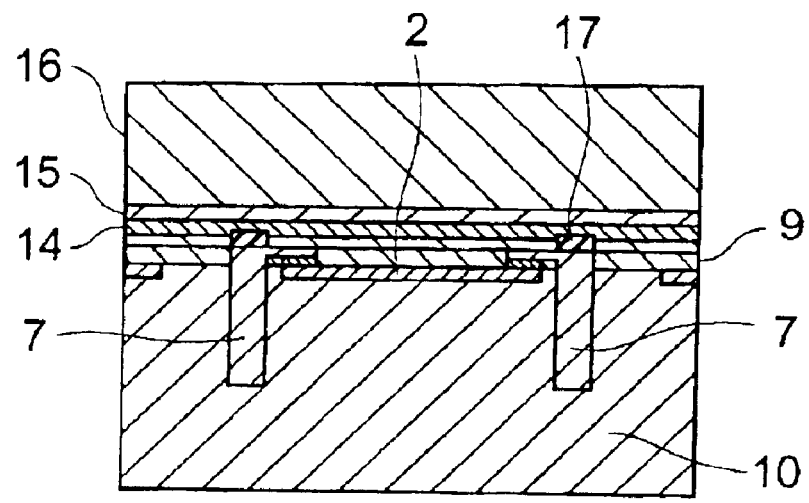
FIG. 13 is a cross sectional view of the semiconductor device in a step of adhering a support member to the organic insulation film through a binding layer according to the second embodiment of the present invention.

FIG. 11 through FIG. 13 show the respective process steps of a method for manufacturing a semiconductor device according to a second embodiment of the present invention.

In this embodiment, after the connecting wirings 12 of the first embodiment shown in FIG. 4 have been formed, protrusion electrodes 17 made of copper are formed on the principal plane 1 (see FIG. 11), and an organic insulation film 14 is then applied or formed by spin coating (see FIG. 12).

After this, the respective process steps after the step of adhering a support member 16 to the organic insulation film 14 through a binding layer 15 is similar to the first embodiment.

In this second embodiment, the thickness of the coated film is made greater than the height of each of the protrusion electrodes 17, so that surface irregularities of the substrate proper 10 caused by the protrusion electrodes 17 are smoothed.

In cases where the substrate proper 10 has surface irregularities, there is a fear that when the support member 16 is adhered to the substrate proper 10, air bubbles may be entrained between the support member 16 and the substrate proper 10. However, by properly adjusting the height of the organic insulation film 14, the surface irregularities of the substrate proper 10 can be smoothed so that the support member 16 can be adhered to the substrate proper 10 without entraining air bubbles.

In addition, if the rear surface of the substrate proper 10 is ground by a grinding store in the presence of the unsmoothed surface irregularities of the substrate proper 10 due to the protrusion electrodes 17, those portions of the rear surface of the substrate proper 10 corresponding to the protrusion electrodes 17 are strongly pressed against the grinding stone, whereby the thickness of the substrate proper 10 would become thinner at those portions thereof corresponding to the protrusion electrodes 17 than the remaining portions, or the protrusion electrodes 17 would be collapsed or deformed, thus resulting in the generation of defects or reduction in reliability. According to this second embodiment, however, such a situation can be avoided by smoothing the surface irregularities of the substrate proper 10 as described above.

Embodiment 3.

Although the organic insulation film 14 is used in the above-mentioned first and second embodiments, an organic conductive film having electric conductivity may instead be employed, or a conductive material in the form of an electric conductive paste, which is uniformly distributed in a liquid organic material and which can form an organic conductive film having electric conductivity after being coated, may instead be applied. In the case of such a well-known organic conductive film being used, the protruded portions 6 of the penetration electrodes 7 are short-circuited with each other by the organic conductive film, whereby it becomes possible to use electroplating when the plating films 8 made of the brazing material are formed on the surfaces of the protruded portions 6.

The electric conductive paste may comprise a powder of a metal such as silver, copper, nickel, etc., or an electric conductive filler such as carbon black or the like, which is mixed and kneaded into a resin. Alternatively, the electric conductive paste may comprise an electric conductive polymer such as polypyrrole, polythiophene or the like with an electrolyte being mixed and kneaded therein.

In this third embodiment, owing to the use of electroplating, the plating films 8 can not only be formed thicker in comparison with the case where electroless plating in the form of a liquid-phase selective growth process is employed, but also controllability of the film thickness is good and the adhesion or adhesive force of the plating films 8 is large.

Furthermore, the use of the organic conductive films is also effective even when the above-mentioned electroless plating is carried out upon formation of the plating films 8 on the protruded portions 6. That is, similarly, the protruded portions 6 of the penetration electrodes 7 are short-circuited with each other by the organic conductive film, and hence all the penetration electrodes 7 are kept at the same potential. Accordingly, there will be neither variations in the film thickness of the plating films nor the defective growth thereof, which would be influenced by a difference in potential between the respective penetration electrodes 7 when the organic insulation film 14 is used, i.e., a difference in electrons between the electrodes or a difference in potential from the semiconductor substrate, generated depending upon whether the penetration electrodes 7 are connected through the connecting wirings 12 with P-type semiconductor circuits or with N-type semiconductor circuits.
Embodiment 4.

Figure 14A:
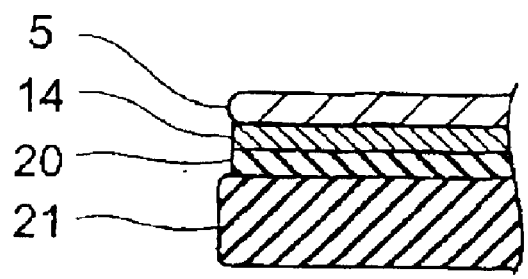
FIG. 14A is a cross sectional view of a semiconductor device showing that a support member is adhered to a semiconductor substrate by a binding layer and an organic insulation film according to a fourth embodiment of the present invention.
Figure 14B:
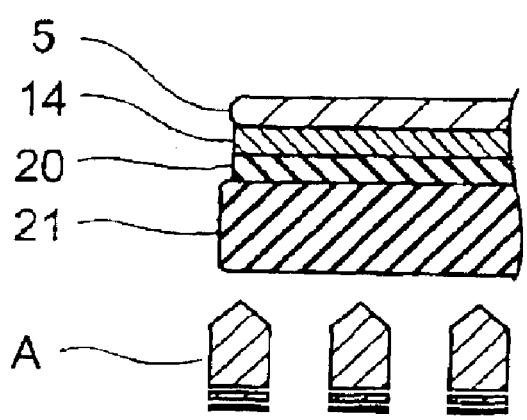
FIG. 14B is a cross sectional view of the semiconductor device showing that ultraviolet rays are irradiated to a stack of layers of the semiconductor device from a support member side according to the fourth embodiment of the present invention.
Figure 14C:
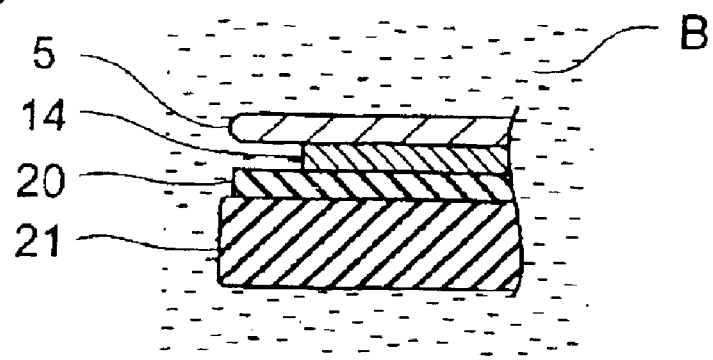
FIG. 14C is a cross sectional view of the semiconductor device showing that the organic insulation film is dissolved by a medical or chemical liquid according to the fourth embodiment of the present invention.

FIGS. 14A through 14C show the respective process steps of a method for manufacturing a semiconductor device according to a fourth embodiment of the present invention.

FIG. 14A shows the state in which an organic insulation film 14 is coated on a semiconductor substrate 5, which is adhered to a support member 21, which is formed of a quartz glass that is transparent at least in the ultraviolet range, through a binding layer 20 having the property that the adhesion thereof is extremely decreased by ultraviolet irradiation.

In this embodiment, ultraviolet rays A are irradiated from the side of the support member 21 to a stack of layers to weaken the adhesion of the binding layer 20, as shown in FIG. 14B, and thereafter the entire stack is immersed in a chemical liquid B in the form of toluene, as shown in FIG. 14C.

Incidentally, it is to be noted that in the case of absence of the organic insulation film 14, the binding layer 20 loses its adhesion under the action of ultraviolet irradiation but the support member 21 does not easily peel off from the semiconductor substrate 5.

Figure 15:
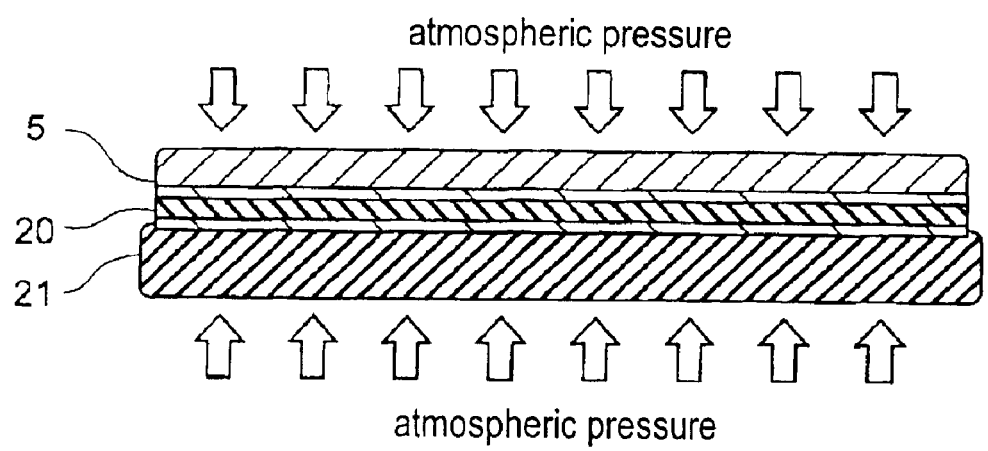
FIG. 15 is a view explaining that it is difficult to peel off the support member from the semiconductor substrate.

FIG. 15 is a view for explaining this fact. FIG. 15 shows a stack of layers when the binding layer 20 loses its adhesion under the action of ultraviolet irradiation in the absence of the organic insulation film 14. At this time, both of the interfaces of the binding layer 20 at the side of the semiconductor substrate 5 and at the side of the support member 21 are in a kind of vacuum state in which air does not exist between the binding layer 20 and the semiconductor substrate 5 and between the binding layer 20 and the support member 21. The support member 21 and the semiconductor substrate 5 are usually boards having areas of about several hundreds of square centimeters. The binding layer 20 are pressed from its opposite sides by a force of about several hundreds of Kg at 1 atmospheric pressure, depending on a differential pressure between the pressure at the interfaces and the ambient atmospheric pressure. Therefore, in a case where the support member 21 made of quartz glass can not be easily peeled off mechanically from the semiconductor substrate 5 due to the flexible deformation of the support member 21, it is impossible to easily peel off the support member 21 from the semiconductor substrate 5 even if the binding layer 20 has lost its adhesion.

In order to facilitate such peeling off, the organic insulation film 14 is formed on one surface of the semiconductor substrate 5, and after irradiation of ultraviolet rays A, the stack of layers is immersed in the chemical liquid B in the form of toluene, so that the peripheral portions of the organic insulation film 14 are dissolved thereby. In this manner, the peeling off of the support member 21 is facilitated. That is, a long period of time is required to completely dissolve the organic insulation film 14, but permeation of the chemical liquid is carried out only in the peripheral portions of the organic insulation film 14, and hence the dissolution of the organic insulation film 14 can be performed only in the peripheral portions thereof, thereby making it possible to reduce the time of dissolution thereof. On the other hand, a gap or clearance is generated between the support member 21 (including the binding layer 20 that has lost its adhesion) and the semiconductor substrate 5 in the peripheral portions of the organic insulation film 14, so that the vacuum between the support member 21 and the semiconductor substrate 5 becomes liable to be broken, thus facilitating peeling off between the support member 21 and the semiconductor substrate 5.

In addition, in this fourth embodiment, the above-mentioned operation and effects in the first through third embodiments are not lost but maintained.

Here, note that if only the easiness of the peeling off is required, the organic insulation film 14 may be formed on the support member 21 side. Moreover, if only the easiness of the peeling off is required, the organic insulation film 14 may be formed at a constant width from the outer peripheries of the semiconductor substrate 5 and the support member 21 so as to overlap with the binding layer, thereby providing the same peeling off effect. In this case, too, the organic insulation film 14 may be formed either at the semiconductor substrate side or at the support member side.

In this fourth embodiment, when the support member 21, which has become unnecessary after the grinding, plating or like other treatment of the rear side of the substrate proper 10, is peeled off, it is possible to perform the peeling off of the support member 21 and the removal of the organic insulation film 14 at the same time since the organic insulation film 14 is easily dissolved by the acetone liquid which is used upon removal of the organic insulation film 14.

Further, since a gap or clearance between the semiconductor substrate 5 and the support member 21 can be easily formed due to the dissolution of the organic insulation film 14 at least at the peripheral portions thereof, the vacuum between the support member 21 and the semiconductor substrate 5 becomes liable to be broken as described above, whereby after breakage of the vacuum, the support member 21 can be mechanically peeled off from the semiconductor substrate 5 in an easy manner.

Although photoresist, which is mainly used in the manufacturing processes of semiconductor devices, is employed as the organic insulation film 14 in the above-mentioned first and second embodiments, there is no necessity for using the photoresist but any material may instead be employed which has the following properties. That is, a liquid (gel state) material having flowability is coated on one surface of the substrate proper 10 to form a thermosetting film thereon which can be thermally set or hardened by heat treatment or the like, and which has an adhesive property and chemical resistance to medicaments or chemical substances used in respective process steps after the adhesion step in which the support member 16 for supplementing the mechanical rigidity of the substrate proper 10 is adhered to the organic insulation film 14, the thermosetting film being further required to be dissolved in or peeled off from a medicament or chemical substance which is used in the removal step for removing the support member 16 and the organic insulation film 14 from the semiconductor substrate 5.

Furthermore, although in the above-mentioned respective embodiments, the plating films 8 are formed on the surfaces of the protruded portions 6 under a liquid-phase environment, it may instead be formed through a vapor-phase selective growth process.

Still further, the binding layer 15 is interposed between the support member 16 and the organic insulation film 14 in the above-mentioned first and second embodiments, and the binding layer 15 is interposed between the support member 16 and the organic conductive film in the above-mentioned third embodiment. However, if the organic insulation film 14 or the organic conductive film has enough adhesion to the support member 16, the binding layer 15 may be omitted.

What is claimed is:

1. A method for manufacturing a semiconductor device, said method comprising:

a recess forming step of forming recesses in a substrate proper that has semiconductor circuits and electrodes formed on one surface thereof;

an embedded electrode forming step of filling a conductive material into said recesses to form embedded electrodes that constitute penetration electrodes;

a connection step of electrically connecting said electrodes on said substrate proper and said embedded electrodes with one another;

an organic film forming step of forming an organic film on the one surface of said substrate proper;

an adhesion step of adhering a support member, which supplements the mechanical rigidity of said substrate proper, to said organic film;

a semiconductor substrate forming step of removing a rear side of said substrate proper opposite to said one surface thereof until a bottom of each said embedded electrodes is exposed and protruded, thereby to form said penetration electrodes and a thinned semiconductor substrate;

a film forming step of forming plating films on surfaces of the protruded portions of said embedded electrodes; and a removal step of removing said support member and said organic film from said semiconductor substrate;

wherein said organic film has an adhesive property and chemical resistance to chemical substances used in respective process steps after said adhesion step, said organic film being at least dissolved in or peeled off from said semiconductor substrate by a chemical substance used in said removal step.

2. The method for manufacturing a semiconductor device according to claim 1, said method further comprising a step of forming a binding layer between said organic film and said support member.

3. The method for manufacturing a semiconductor device according to claim 2, wherein said support member is formed of a material through which ultraviolet rays are able to pass, and said binding layer is formed of a material which loses its adhesion when irradiated by ultraviolet rays; and in said removal step, said ultraviolet rays are irradiated to said binding layer from a side of said support member, and said support member is peeled off from said semiconductor substrate after at least the peripheral portions of said organic film are dissolved and removed up to a depth reaching said binding layer by a chemical liquid that constitutes said chemical substance.

4. The method for manufacturing a semiconductor device according to claim 3, wherein said support member comprises quartz glass.

5. The method for manufacturing a semiconductor device according to claim 1, wherein said support member and said organic film are removed from said semiconductor substrate in one and the same process step.

6. The method for manufacturing a semiconductor device according to claim 1, said method further comprising a step of forming protrusion electrodes on a principal plane of said semiconductor device after said connection step.

7. The method for manufacturing a semiconductor device according to claim 1, wherein said film forming step is performed through electroless plating which is a liquid-phase selective growth process or through a vapor-phase selective growth process.

8. The method for manufacturing a semiconductor device according to claim 1, wherein said organic film comprises an organic insulation film formed of a photoresist.

9. The method for manufacturing a semiconductor device according to claim 1, wherein said organic film comprises an organic conductive film formed of a conductive paste, and said film forming step is performed through electrolytic plating or electroless plating while keeping said penetration electrodes at the same potential.

10. The method for manufacturing a semiconductor device according to claim 1, wherein said organic film is formed by means of a spin coating method.

* * * * *